US012485481B2

(12) United States Patent
Birkicht et al.

(10) Patent No.: US 12,485,481 B2
(45) Date of Patent: Dec. 2, 2025

(54) SINTERING PRESS AND PRESSURE SINTERING METHOD FOR PRODUCING A SINTERED CONNECTION BY MEANS OF THE SINTERING PRESS

(71) Applicant: SEMIKRON ELEKTRONIK GMBH & CO. KG, Nuremberg (DE)

(72) Inventors: Dominic Birkicht, Emskirchen (DE); Juri Heinrich, Rosstal (DE); Thomas Franz, Winkelhaid (DE); Rudi Ludwig, Altdorf (DE); Silke Kraft, Nuremberg (DE); Erik Michaelsen, Lauf (DE); Johannes Weickmann, Forchheim (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 18/944,775

(22) Filed: Nov. 12, 2024

(65) Prior Publication Data

US 2025/0065400 A1 Feb. 27, 2025

Related U.S. Application Data

(62) Division of application No. 17/021,799, filed on Sep. 15, 2020, now abandoned.

(30) Foreign Application Priority Data

Oct. 23, 2019 (DE) ..................... 10 2019 128 667.0

(51) Int. Cl.
*H01L 23/00* (2006.01)
*B22F 3/03* (2006.01)
(Continued)

(52) U.S. Cl.
CPC ................ *B22F 7/064* (2013.01); *B22F 3/03* (2013.01); *B22F 7/08* (2013.01); *H01L 24/29* (2013.01);
(Continued)

(58) Field of Classification Search
CPC ... H01L 2224/8384; H01L 2224/75301; H01L 2224/75744; H01L 24/03; H01L 24/04;
(Continued)

(56) References Cited

U.S. PATENT DOCUMENTS 11,745,263 B2 * 9/2023 Birkicht ................. H01L 21/60
419/9
2003/0027371 A1 * 2/2003 Sunagawa ............... H01L 21/50
257/E21.503

(Continued)

FOREIGN PATENT DOCUMENTS

DE  102013210847 A1  12/2014
DE  102017116373 B3 *  8/2018
(Continued)

OTHER PUBLICATIONS

DE-102017116373-B3 Espacenet English Machine Translation (Year: 2025).*

(Continued)

*Primary Examiner* — Melvin C. Mayes
(74) *Attorney, Agent, or Firm* — Andrew F. Young, ESQ.; NOLTE LACKENBACH SIEGEL (57) ABSTRACT

A sintering press for producing a sintered connection between a first connection partner and a second connection partner disposed thereabove, having a suction-fixing installation for fixing the first connection partner, having a compression piece which is disposed above the suction-fixing installation. The sintering press for producing the sintered connection is configured for converging the compression
(Continued)

piece and the suction-fixing installation relative to one another and for mutually compressing the first connection partner and the second connection partner, wherein the suction-fixing installation on the side thereof that faces the compression piece has first suction openings, wherein the suction-fixing installation, when the first connection partner is disposed above the first suction openings, by generating a negative pressure at the first suction openings, is configured for suctioning the first connection partner and, on account thereof, for fixing the latter in relation to the suction-fixing installation. The invention furthermore relates to a pressure sintering method for producing a sintered connection by the sintering press.

1 Claim, 3 Drawing Sheets

(51) Int. Cl.
*B22F 7/06* (2006.01)
*B22F 7/08* (2006.01)

(52) U.S. Cl.
CPC .............. *H01L 24/32* (2013.01); *H01L 24/75* (2013.01); *H01L 24/83* (2013.01); *H01L 2224/29239* (2013.01); *H01L 2224/32225* (2013.01); *H01L 2224/75301* (2013.01); *H01L 2224/75744* (2013.01); *H01L 2224/8384* (2013.01)

(58) Field of Classification Search
CPC ....... H01L 21/6838; H01L 2224/80047; H01L 2224/8009; H01L 2224/8309; B22F 7/064; B22F 3/03; B22F 7/08
See application file for complete search history.

(56) References Cited

U.S. PATENT DOCUMENTS

| | | | |
|---|---|---|---|
| 2008/0213947 A1* | 9/2008 | Shimonaka | H01L 23/3121 257/E23.125 |
| 2013/0203218 A1* | 8/2013 | Bayerer | B32B 37/10 156/382 |
| 2014/0013595 A1* | 1/2014 | Hong | H01L 24/83 156/60 |
| 2017/0028598 A1* | 2/2017 | Choi | B29C 43/021 |
| 2017/0144246 A1* | 5/2017 | Bogen | H01L 24/75 |
| 2017/0243851 A1* | 8/2017 | Rangelov | H01L 24/97 |
| 2019/0043749 A1* | 2/2019 | Jeunink | G03F 7/707 |
| 2019/0333800 A1* | 10/2019 | Heo | H01L 21/67288 |
| 2020/0273836 A1* | 8/2020 | Sugaya | H01L 24/74 |

FOREIGN PATENT DOCUMENTS

| | | |
|---|---|---|
| DE | 102017113060 A1 | 12/2018 |
| DE | 102018119310 B3 | 8/2019 |
| DE | 102015120156 A1 | 5/2024 |

OTHER PUBLICATIONS

DE 10 2019 128 667.0, Decision to Grant dated Jun. 20, 2020, 5 pages—English, 11 pages—German, Certificate of Translation dated Nov. 11, 2024.

DE 10 2019 128 667.0, Notice of Allowability dated Mar. 20, 2020, 3 pages—English, 3 pages—German, Certificate of Translation dated Nov. 11, 2024.

DE 10 2019 128 667.0, Search Report dated Mar. 20, 2020, 5 pages—German, 5 pages—English.

* cited by examiner

SINTERING PRESS AND PRESSURE SINTERING METHOD FOR PRODUCING A SINTERED CONNECTION BY MEANS OF THE SINTERING PRESS

CROSS REFERENCE TO RELATED APPLICATIONS

This application is a divisional (DIV) of U.S. Ser. No. 17/021,779 filed Sep. 15, 2020, the entire contents of which are incorporated herein by reference; which in turn relates to and claims priority to DE 10 2019 128 667.0 filed Oct. 23, 2019, the entire contents of which are incorporated herein by reference.

FIGURE SELECTED FOR PUBLICATION

FIG. 1

BACKGROUND OF THE INVENTION

Field of the Invention

The invention relates to a sintering press and to a pressure sintering method for producing a sintered connection by means of the sintering press.

Description of the Related Art

A pressure sintering method in which a first connection partner, for example a substrate, by way of a sintered connection is connected to a second connection partner, for example a power semiconductor component, is known from DE 10 2015 120 156 A1. The first connection partner on which the second connection partner is disposed herein is placed on a lower tool of a sintering press, wherein a sintering material to be sintered is disposed between the two connection partners. A plastic film portion of a plastic film is preferably disposed on the connection partners. An impingement of the connection partners with a pressure in the direction of the lower tool by means of a compression piece and an elastic pressure pad of a sintering press as well as an impingement of the sintering material with a temperature subsequently takes place, wherein the sintering material herein is converted to a sintered metal, the sintered connection between the connection partners being configured on account thereof. After the sintered connection has been configured, the compression piece and the elastic pressure pad are lifted away from the connection partners again.

It is disadvantageous herein that the connection partners can adhere to the pressure pad, or in the case of a plastic film portion of a plastic film being disposed between the pressure pad and the connection partners during the impingement of pressure, that the connection partners can adhere to the plastic film and thus may be altered in terms of the position and/or orientation of said connection partners in the sintering press and the connection partners may in particular be lifted conjointly with the pressure pad or the plastic film, respectively, when the elastic pressure pad, or the plastic film, respectively, is lifted.

ASPECTS AND SUMMARY OF THE INVENTION

It is an object of the invention to achieve a sintering press for producing a sintered connection between a first connection partner and a second connection partner disposed thereabove, wherein the first sintering partner can be reliably fixed in the sintering press.

This object is achieved by a sintering press for producing a sintered connection between a first connection partner and a second connection partner disposed thereabove, having a suction-fixing installation for fixing the first connection partner, having a compression piece which is disposed above the suction-fixing installation, wherein the sintering press for producing the sintered connection, when the first connection partner and the second connection partner are disposed between the compression piece and the suction-fixing installation, is configured for converging the compression piece and the suction-fixing installation relative to one another and, on account thereof, for mutually compressing the first connection partner and the second connection partner, wherein the suction-fixing installation on the side thereof that faces the compression piece has first suction openings, wherein the suction-fixing installation, when the first connection partner is disposed above the first suction openings, by means of generating a negative pressure at the first suction openings, is configured for suctioning the first connection partner and, on account thereof, for fixing the latter in relation to the suction-fixing installation.

This object is furthermore achieved by a pressure sintering method for producing a sintered connection between a first connection partner and a second connection partner disposed thereabove by means of a sintering press according to the invention, comprising the following method steps in succession:
  a) disposing between the compression piece and the suction-fixing installation the first connection partner conjointly with the second connection partner disposed above the first connection partner, wherein a sintering material to be sintered is disposed between the first connection partner and the second connection partner, wherein the first connection partner is disposed above the first suction openings;
  b) fixing the first connection partner in relation to the suction-fixing installation by suctioning the first connection partner by means of generating a negative pressure at the first suction openings;
  c) impinging the first connection partner and the second connection partner and the sintering material with a pressure by converging the compression piece and the suction-fixing installation relative to one another, wherein, on account thereof, the first connection partner and the second connection partner are mutually compressed, and impinging the sintering material with a temperature, wherein the sintering material on account of the impingement with pressure and temperature is converted to a sintered metal;
  d) diverging the compression piece and the suction-fixing installation relative to one another;
  e) releasing the first connection partner in relation to the suction-fixing installation by reinstating the gas pressure prevailing above the first connection partner at the first suction openings.

Advantageous configurations of the method are derived in a manner analogous to advantageous configurations of the sintering press and vice versa.

It proves advantageous for the suction-fixing installation to be disposed on a compression counterpart of the sintering press, or to be an integral component part of a compression counterpart of the sintering press. The sintering press is of a particularly simple construction when the suction-fixing installation is disposed on a compression counterpart of the sintering press. The sintering press is of a particularly compact construction when the suction-fixing installation is an integral component part of a compression counterpart of the sintering press.

It furthermore proves advantageous for the respective cross-sectional area of the first suction openings to be 0.007 mm² to 3.2 mm², in particular 0.03 mm² to 1.8 mm². The cross-sectional area of the first suction openings is thus preferably relatively small. Damage to the first connection partner, and in particular breaking of the first connection partner, is reliably avoided on account thereof when a high pressure acts on the first connection partner, such as on a substrate, for example, during the pressing procedure, despite said first connection partner not bearing across the full area, the latter being caused by the first suction openings.

It furthermore proves advantageous for the side of the suction-fixing installation that faces the compression piece to have an in particular rectangular fixing region, wherein the first suction openings are disposed within the fixing region, wherein at least some of the first suction openings are disposed in a peripheral region of the fixing region or are disposed in a central region of the fixing region. Fixing of the first connection partner in a highly load-bearing manner is enabled on account thereof.

In this context, it proves advantageous for the side of the suction-fixing installation that faces the compression piece to have a rectangular fixing region, wherein the number of first suction openings in the corner regions of the fixing region is increased in comparison to other regions of the fixing region. Fixing of the first connection partner in a highly load-bearing manner is enabled on account thereof.

It furthermore proves advantageous for the sintering press to have a suction gripper which, by means of generating a negative pressure at the suction openings thereof, is configured for firmly holding the first connection partner directly or indirectly on said suction gripper and, prior to the pressing procedure, for disposing the first connection partner conjointly with the second connection partner disposed above the first connection partner in the space between the compression piece and the suction-fixing installation and/or, after the pressing procedure, for removing said first connection partner conjointly with said second connection partner from said space again. By means of a suction gripper, the first connection partner conjointly with the second connection partner disposed above the first connection partner prior to the pressing procedure can be very rapidly disposed in the space between the compression piece and the suction-fixing installation and/or can be very rapidly removed from said space again after the pressing procedure.

It furthermore proves advantageous for the sintering press for producing the sintered connection, when the first connection partner and the second connection partner are disposed between the compression piece and the suction-fixing installation and the first connection partner is disposed directly on the suction-fixing installation, to be configured for converging the compression piece and the suction-fixing installation relative to one another and, on account thereof, for mutually compressing the first connection partner and the second connection partner, wherein the suction-fixing installation on the side thereof that faces the compression piece has first suction openings, wherein the suction-fixing installation, when the first connection partner is disposed above the first suction openings so as to be directly on the suction-fixing installation, by means of generating a negative pressure at the first suction openings, is configured for suctioning the first connection partner and, on account thereof, for fixing the latter in relation to the suction-fixing installation. A particularly economical production of the sintered connection between the first connection partner and the second connection partner disposed thereabove is enabled on account thereof, wherein no workpiece carrier is required for producing the sintered connection.

In this context, it proves advantageous for the suction-fixing installation on the side thereof that faces the compression piece to have at least one second suction opening for suctioning a film portion of a film when the film portion is disposed above the first connection partner and the second connection partner and above the at least one second suction opening, wherein the at least one second suction opening is disposed in such a manner that the first connection partner, when the first connection partner is disposed above the first suction openings, is not disposed above the at least one second suction opening, wherein the suction-fixing installation, when the film portion is disposed above the at least one second suction opening, by means of generating a negative pressure at the at least one second suction opening, is configured for suctioning the film portion and, on account thereof, for fixing the first connection partner in relation to the suction-fixing installation by way of the film portion. On account thereof, the first connection partner in relation to the suction-fixing installation is additionally fixed indirectly by way of the film portion.

It furthermore proves advantageous for preferably elastic delimitation elements to be disposed on the side of the suction-fixing installation that faces the compression piece, said delimitation elements, when the first connection partner is disposed directly on the suction-fixing installation, delimiting or preventing a movement of the first connection partner in a direction perpendicular to the normal direction of the side of the suction-fixing installation that faces the compression piece. On account thereof, the first connection partner is additionally fixed in relation to the suction-fixing installation, albeit only in the direction perpendicular to the normal direction of the side of the suction-fixing installation that faces the compression piece. The delimitation elements furthermore enable a particularly precise positioning of the first connection partner above the first suction openings.

It furthermore proves advantageous for the sintering press for producing the sintered connection, when the first connection partner and the second connection partner are disposed between the compression piece and the suction-fixing installation and the first connection partner is disposed directly on a workpiece carrier having passage openings so as to be above the passage openings and the workpiece carrier is disposed directly on the suction-fixing installation, to be configured for converging the compression piece and the suction-fixing installation relative to one another and, on account thereof, for mutually compressing the first connection partner and the second connection partner, wherein the suction-fixing installation on the side thereof that faces the compression piece has first suction openings, wherein the suction-fixing installation, when the first connection partner is disposed directly on a workpiece carrier having passage ducts so as to be above the passage ducts and the workpiece carrier is disposed directly on the suction-fixing installation in such a manner that the passage ducts are disposed so as to be in alignment with the first suction openings, by means of generating a negative pressure at the first suction openings, is configured for suctioning the first connection partner and, on account thereof, for fixing the latter in relation to the suction-fixing installation. An economical production of the sintered connection between the first connection partner and the second connection partner disposed thereabove is enabled on account thereof.

In this context, it proves advantageous for the suction-fixing installation on the side thereof that faces the compression piece to have at least one second suction opening for fixing the workpiece carrier when the latter is disposed directly on the suction-fixing installation, wherein the suction-fixing installation, when the workpiece carrier is disposed above the at least one second suction opening, by means of generating a negative pressure at the at least one second suction opening, is configured for suctioning the workpiece carrier and, on account thereof, for fixing the latter in relation to the suction-fixing installation. On account thereof, the workpiece carrier is very reliably fixed to the suction-fixing installation.

It furthermore proves advantageous for a frame element which encircles the first connection partner and is movable in relation to the workpiece carrier at least in the normal direction of the side of the suction-fixing installation that faces the compression piece to be disposed on the workpiece carrier, wherein the frame element on the side thereof that faces the suction-fixing installation has ventilation trenches which in the direction perpendicular to the normal direction of the side of the suction-fixing installation that faces the compression piece run through the frame element.

It furthermore proves advantageous between method steps a) and b) or between method steps b) and c) for a film portion of a film to be disposed on the first connection partner and the second connection partner. The film portion prevents the first connection partner and/or the second connection partner from adhering to the compression piece, or in the case of the sintering press according to the invention having a pressure pad between the compression piece and the connection partner, the first connection partner and/or the second connection partner from adhering to the pressure pad.

In this context, it proves advantageous between method steps d) and e) for the film portion to be removed from the first connection partner and the second connection partner. On account of the first connection partner being fixed in relation to the suction-fixing installation when removing the film portion from the first connection partner and the second connection partner, the first connection partner and the second connection partner reliably remain at the position thereof within the sintering press according to the invention when the film portion is removed from the first connection partner and the second connection partner, said first connection partner and said second connection partner not being conjointly removed or conjointly lifted with the film portion in the sintering press according to the invention in the case of the film portion adhering to the first connection partner and/or the second connection partner after the pressing procedure.

In method step a) the first connection partner can be disposed directly on the suction-fixing installation.

Alternatively, when in method step a) the first connection partner is disposed directly on the workpiece carrier having passage ducts so as to be above the passage ducts, the workpiece carrier can be disposed directly on the suction-fixing installation in such a manner that the passage ducts are disposed so as to be in alignment with the first suction openings.

It is to be noted that the elements described in the singular may optionally also be present in multiples. For example, the first connection partner and/or the second connection partner may be present in multiples such that a plurality of sintered connections between the connection partners can be produced in one pressing procedure of the sintering press according to the invention. To this end, a plurality of first connection partners can be disposed above the first suction openings. The respective first connection partner can be assigned a respective fixing region having in each case assigned first suction openings on the side of the suction-fixing installation that faces the compression piece. For example, the sintering press can have a plurality of suction grippers, wherein the respective suction gripper can firmly hold a respective first connection partner.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Figure 1:
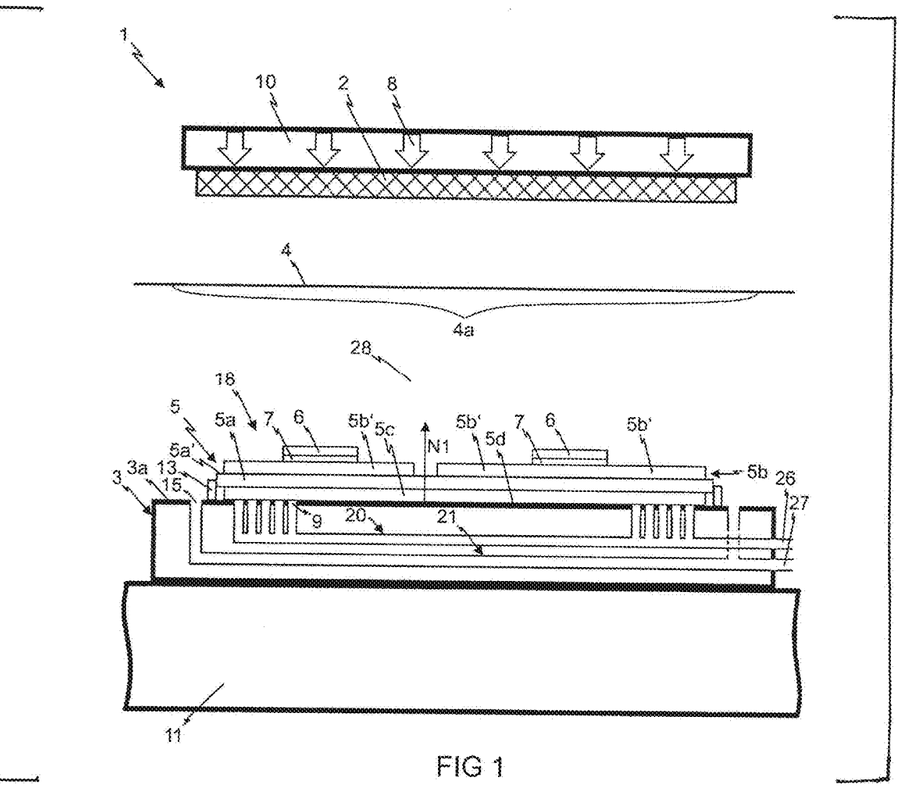
FIG. 1 shows a sectional view of a configuration of the sintering press according to the invention, having first and second connection partners which are disposed in the sintering press.
Figure 2:
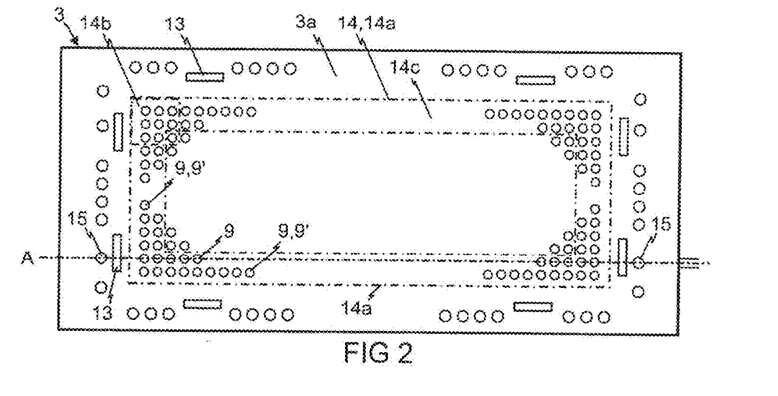
FIG. 2 shows a plan view of FIG. 1 of a side of a suction-fixing installation of the sintering press that faces a compression piece of the sintering press.
Figure 3:
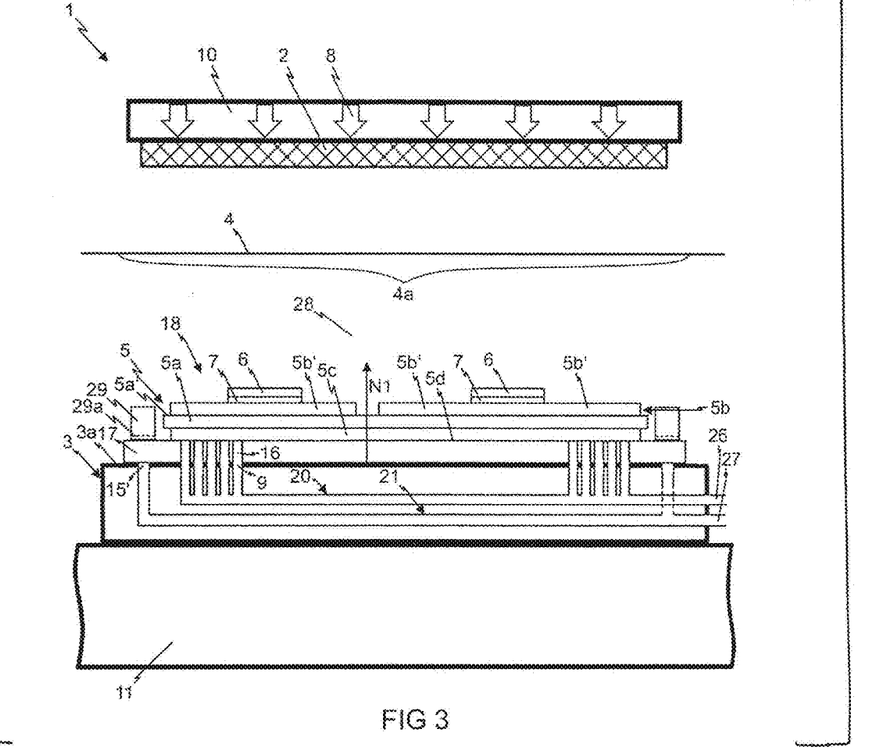
FIG. 3 shows a sectional view of a further configuration of a sintering press according to the invention, having first and second connection partners which are disposed in the sintering press.
Figure 4:
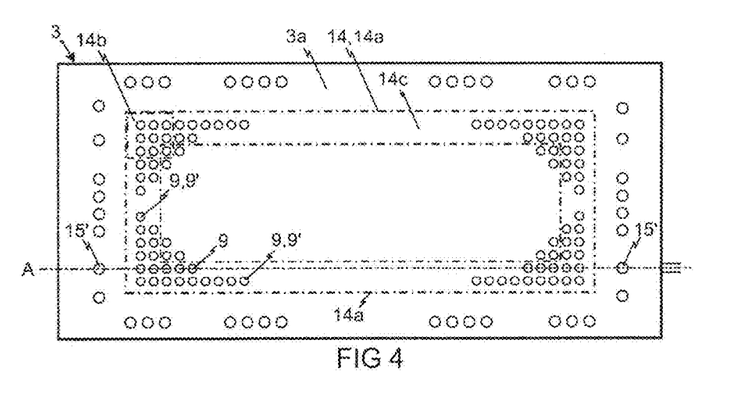
FIG. 4 shows a plan view of FIG. 3 of a side of a suction-fixing installation of the sintering press that faces a compression piece of the sintering press.
Figure 5:
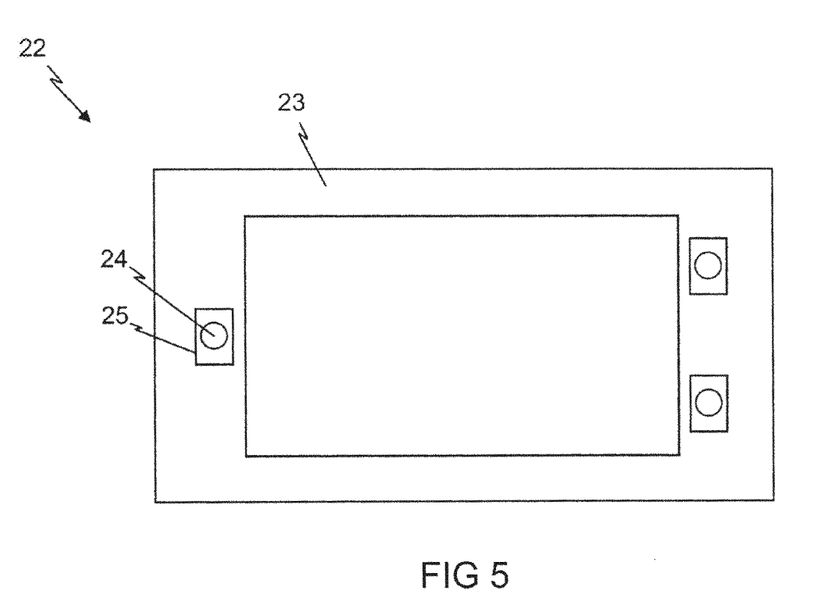
FIG. 5 shows a plan view of a suction gripper of the sintering press according to the invention.

A sectional view of a configuration according to the invention of a sintering press 1 having first connection partners 5 and second connection partners 6 disposed in the sintering press 1 is illustrated in FIG. 1. A plan view of FIG. 1 of a side 3a of a suction-fixing installation 3 of the sintering press 1 that faces a compression piece 10 of the sintering press 1 is illustrated in FIG. 2. A sectional view of a further configuration of a sintering press 1 according to the invention having first connection partners 5 and second connection partners 6 disposed in the sintering press 1 is illustrated in FIG. 3. A plan view of FIG. 3 of a side 3a of a suction-fixing installation 3 of the sintering press 1 that faces a compression piece 10 of the sintering press 1 is illustrated in FIG. 4.

A sintering press 1 according to the invention for producing a sintered connection between a first connection partner 5 and a second connection partner 6 disposed thereabove is illustrated in FIG. 1 and FIG. 3. A sintering material 7 to be sintered is disposed between the first connection partner 5 and the second connection partner 6.

The first connection partner 5 can be configured, for example, as a substrate, as in the exemplary embodiments. The substrate 5 has an insulation layer 5a which is not electrically conducting, a metallizing layer 5b which has been structured so as to form conductor paths 5b' being disposed on the first main side 5a' of said insulation layer 5a that faces the compression piece 10. The conductor paths 5b' are disposed so as to be mutually spaced apart on the insulation layer 5a. The insulation layer 5a is preferably configured as a ceramic board. The substrate 5 preferably has a structured or non-structured further metallizing layer 5c which is disposed on the insulation layer 5a, wherein the insulation layer 5a is disposed between the metallizing layer 5b and the further metallizing layer 5c. The respective metallizing layer 5b or 5c, respectively, is connected to the insulation layer 5a in a materially-bonded manner. The substrate 5 can be configured, for example, as a direct copper bonded substrate (DCB substrate) or as an active metal brazing substrate (AMB substrate). Alternatively, the substrate 5 can also be configured as an insulated metal substrate (IMS substrate).

The second connection partner 6, as in the exemplary embodiments, can be configured as a power semiconductor component, for example, wherein the power semiconductor component 6 is preferably present in the form of a power semiconductor switch or a diode. The respective power semiconductor switch herein is preferably present in the form of a transistor such as, for example, an IGBT (insulated gate bipolar transistor) or in the form of a MOSFET (metal oxide semiconductor field effect transistor) or a thyristor. The second connection partner 6 can however also be configured as an electrically conducting load-connection element, for example.

It is to be noted that the respective connection partner 5 or 6, respectively, can also be composed of a plurality of components which are connected to one another. For example, the first connection partner 5 can thus also comprise a substrate and a power semiconductor component which are already connected to one another in an electrically conducting manner by way of a sintered metal or a solder, and the second connection partner 6 can be present in the form of a metallic foil. The metallic foil is preferably structured so as to form conductor paths and is a component part of a film/foil composite.

The sintering press 1 furthermore has a suction-fixing installation 3 for fixing the first connection partner 5, and a compression piece 10 which is disposed above the suction-fixing installation 3. The compression piece 10 is preferably configured from metal and can be configured, for example, as a metal plate (see in an exemplary manner FIG. 1 and FIG. 3) or as a die. The sintering press 1 can have an elastic pressure pad 2 which is disposed between the suction-fixing installation 3 and the compression piece 10 and which can be composed of silicone, for example. The pressure pad 2 is preferably connected to the compression piece 10.

A film portion 4a of a film 4, in particular of a plastic film 4 which is preferably configured as a polytetrafluoroethylene film (PTFE film) can be disposed between the compression piece 10 and the suction-fixing installation 3 or, if present, between the pressure pad 2 and the suction-fixing installation 3. The film portion 4a can be disposed manually on the first connection partner 5 and the second connection partner 6 prior to the pressing procedure carried out by the sintering press 1 for producing the sintered connection, for example, and after the pressing procedure, once the sintered connection has been produced, can again be manually lifted from the first connection partner 5 and the second connection partner 6 in the direction of the normal direction N1 of the side 3a of the suction-fixing installation 3 that faces the compression piece 10. Alternatively, this procedure can also take place in an automated manner by means of a film-moving installation.

The sintering press 1 for producing the sintered connection, when the first connection partner 5 and the second connection partner 6 are disposed between the compression piece 10 and the suction-fixing installation 3, is configured for converging the compression piece 10 and the suction-fixing installation 3 relative to one another and, on account thereof, for mutually compressing the first connection partner 5 and the second connection partner 6. The converging of the compression piece 10 and of the suction-fixing installation 3 relative to one another in the invention can take place in that the compression piece 10 moves downward and/or in that the suction-fixing installation 3 moves upward, as is illustrated by the arrows 8 in FIG. 1 and FIG. 3.

The suction-fixing installation 3 on the side 3a thereof that faces the compression piece 10 has first suction openings 9, wherein the suction-fixing installation 3, when the first connection partner 5 is disposed above the first suction openings 9, by means of generating a negative pressure at the first suction openings 9, is configured for suctioning the first connection partner 5 and, on account thereof, for fixing the latter in relation to the suction-fixing installation 3. The first connection partner 5, as is illustrated in an exemplary manner in FIG. 1 and FIG. 3, covers the first suction openings 9. The first connection partner 5 is disposed in the region of the first suction openings 9. On account of the first connection partner 5 by means of the suction-fixing installation 3 being fixed in relation to the suction-fixing installation 3, a movement of the first connection partner 5, in particular in the normal direction N1 of the side 3a of the suction-fixing installation 3 that faces the compression piece 10, in relation to the suction-fixing installation 3 is prevented. When the first connection partner 5 and/or the second connection partner 6 after the impingement with pressure by the sintering press 1 adhere(s) to the compression piece 10 or, if present, to the pressure pad 2, or when the first connection partner 5 and/or the second connection partner 6 adhere(s) to the plastic film portion 4a if a plastic film portion 4a of a plastic film 4 is disposed between the pressure pad 2 and the connection partners 5 and 6 during the impingement with pressure, the first connection partner 5 and thus also the second connection partner 6 remain fixed in relation to the suction-fixing installation 3 when the compression piece 10, or the elastic pressure pad 2, or the plastic film 4, respectively, is lifted after the impingement with pressure, or after producing the sintered connection, respectively, such that said connection partners 5, 6 are not lifted conjointly with the compression piece 10, or with the pressure pad 2, or with the plastic film 4, respectively.

The suction-fixing installation 3, as is illustrated in an exemplary manner in FIG. 1 and FIG. 3, can be disposed on a compression counterpart 11 of the sintering press 1 and preferably be connected to said compression counterpart 11 by means of a force-fitting and/or form-fitting connection, for example, in particular by means of a screw connection, or be an integral component part of a compression counterpart 11 of the sintering press 1. The compression counterpart 11 is preferably configured from metal. The suction-fixing installation 3 and/or the compression counterpart 11 and/or the compression piece 10 preferably have a heat generation installation which is not illustrated in the figures and by means of which the first connection partner 5 and/or the second connection partner 6 and thus the sintering material 7 to be sintered can be heated for producing the sintered connection.

The respective cross-sectional area of the first suction openings 9 is preferably 0.007 mm2 to 3.2 mm2, in particular 0.03 mm2 to 1.8 mm2. The cross-sectional area of the first suction openings 9 is thus preferably relatively small. Damage to the first connection partner 5, and in particular breaking of the first connection partner 5, is reliably avoided on account thereof when a high pressure acts on the first connection partner 5, such as on a substrate, for example, during the pressing procedure, despite said first connection partner 5 not bearing across the full area, the latter being caused by the first suction openings 9. The first suction openings 9 preferably have a circular shape.

As is illustrated in an exemplary manner in FIG. 2 and FIG. 4, the side 3a of the suction-fixing installation 3 that faces the compression piece 10 preferably has a preferably rectangular fixing region 14, wherein the first suction openings 9 are disposed within the fixing region 14, wherein at least some 9' of the first suction openings 9 are disposed in a peripheral region 14c of the fixing region 14, or are disposed in a central region of the fixing region 14 (not illustrated in the figures). All first suction openings 9 can also be disposed in the peripheral region 14c of the fixing region 14, or be disposed in the central region of the fixing region 14. At least some of the first suction openings 9 can be disposed along at least one lateral periphery 14a of the fixing region 14. All first suction openings 9 can also be disposed along at least one lateral periphery 14a of the fixing region 14. The shape of the fixing region 14 is preferably adapted to the perimeter shape of the side 5d of the first connection partner 5 that faces the suction-fixing installation 3. In the case of a rectangular fixing region 14, the number of first suction openings 9 preferably in corner regions 14b of the fixing region 14 is increased in comparison to other regions of the fixing region 14.

In the exemplary embodiment according to FIG. 1 and FIG. 2, the first connection partner 5 is disposed directly on the suction-fixing installation 3, more specifically directly on the side 3a of the suction-fixing installation 3 that faces the compression piece 10, so as to be above the first suction openings 9. The first connection partner 5 mechanically contacts the suction-fixing installation 3, more specifically the side 3a of the suction-fixing installation 3 that faces the compression piece 10. The suction-fixing installation 3, when the first connection partner 5 is disposed directly on the suction-fixing installation 3 so as to be above the first suction openings 9, by means of generating a negative pressure at the first suction openings 9, is configured for suctioning the first connection partner 5 and, on account thereof, for fixing the latter in relation to the suction-fixing installation 3. The first connection partner 5 in the exemplary embodiment according to FIG. 1 and FIG. 2 is thus fixed directly on the suction-fixing installation 3 by the suction-fixing installation 3.

In the exemplary embodiment according to FIG. 1 and FIG. 2, the suction-fixing installation 3 on the side 3a thereof that faces the compression piece 10 preferably has at least one second suction opening 15 for suctioning the film portion 4a of the film 4 when the film portion 4a is disposed above the first connection partner 5 and the second connection partner 6 and above the at least one second suction opening 15. The at least one second suction opening 15 is disposed in such a manner that the first connection partner 5, when the first connection partner 5 is disposed above the first suction openings 9, is not disposed above the at least one second suction opening 15. The suction-fixing installation 3, when the film portion 4a is disposed above the at least one second suction opening 15, by means of generating a negative pressure at the at least one second suction opening 15, is configured for suctioning the film portion 4a and, on account thereof, for fixing the first connection partner 5 in relation to the suction-fixing installation 3 by way of the film portion 4a. On account thereof, the first connection partner 5 in relation to the suction-fixing installation 3 is additionally fixed indirectly by way of the film portion 4a. The suction-fixing installation 3, as is illustrated in an exemplary manner in FIG. 2, can have a plurality of second suction openings 15 which in a projected view toward the first connection partner 5 are preferably disposed so as to encircle the first connection partner 5. The at least one second suction opening 15 may also be configured in the shape of a slot.

Preferably elastic delimitation elements 13 can be disposed on the side 3a of the suction-fixing installation 3 that faces the compression piece 10, said delimitation elements 13, when the first connection partner 5 is disposed directly on the suction-fixing installation 3, delimiting or preventing a movement of the first connection partner 5 in the direction perpendicular to the normal direction N1 of the side 3a of the suction-fixing installation 3 that faces the compression piece 10, thus in addition to the suction-fixing installation 3 fixing the first connection partner 5, albeit only in the direction perpendicular to the normal direction N1 of the side 3a of the suction-fixing installation 3 that faces the compression piece 10. The suction-fixing installation 3 in relation to the suction-fixing installation 3 fixes the first connection partner 5 in the direction perpendicular to the normal direction N1 of the side 3a of the suction-fixing installation 3 that faces the compression piece 10 and in the direction of the normal direction N1 of the side 3a of the suction-fixing installation 3 that faces the compression piece 10. The delimitation elements 13 preferably also serve as positioning aids for positioning the first connection partner 5 above the first suction openings 9. The delimitation elements 13 can be configured from silicone, for example.

As opposed to the configuration of the invention according to FIG. 1 and FIG. 2, a workpiece carrier 17 is disposed between the suction-fixing installation 3 and the second connection partner 6 in the configuration of the invention according to FIG. 3 and FIG. 4. The workpiece carrier 17 has passage ducts 16 running therethrough. The first connection partner 5 is disposed directly on the workpiece carrier 17 so as to be above the passage ducts 16. The first connection partner 5 thus mechanically contacts the workpiece carrier 17. The workpiece carrier 17 is disposed directly on the suction-fixing installation 3, more specifically on the side 3a of the suction-fixing installation 3 that faces the compression piece 10, so as to be above the first suction openings 9. The workpiece carrier 17 thus mechanically contacts the suction-fixing installation 3, more specifically the side 3a of the suction-fixing installation 3 that faces the compression piece 10. The suction-fixing installation 3, when the first connection partner 5 is disposed directly on the workpiece carrier 17 so as to be above the passage ducts 16 and the workpiece carrier 17 is disposed directly on the suction-fixing installation 3 in such a manner that the passage ducts 16 are disposed so as to be in alignment with the first suction openings 9, by means of generating a negative pressure at the first suction openings 9, is configured for suctioning the first connection partner 5 and, on account thereof, fixing the latter in relation to the suction-fixing installation 3.

The negative pressure generated at the first suction openings 9 has the effect that a negative pressure is generated in the passage ducts 16 such that the first connection partner 5 is suctioned through the workpiece carrier 17 by the suction-fixing installation 3 and is thus fixed in relation to the suction-fixing installation 3. The gas pressure prevailing in the press chamber 28 of the sintering press 1 above the first connection partner 5 pushes the first connection partner 5 against the workpiece carrier 17, and the workpiece carrier 17 against the suction-fixing installation 3. The gas pressure is preferably present in the form of the air pressure. The pressing procedure of the sintering press 1 for producing a sintered connection takes place in the press chamber 28. The workpiece carrier 17 preferably serves for transporting the first connection partner 5 conjointly with the second connection partner 6 disposed thereabove and with the sintering material 7 which is to be sintered and is disposed between the connection partners 5 and 6 into the sintering press 1 and out of the sintering press 1 once the sintered connection has been produced, wherein the sintering material 7 on account of being impinged with pressure and temperature in the sintering press 1 is converted to a sintered metal.

The sintering material 7 to be sintered is preferably present in the form of a sintering paste common in this technology. The sintering material 7, in particular the sintering paste, contains metal particles, for example of silver. The workpiece carrier 17 can be present, for example, in the form of a metal plate having passage ducts. The workpiece carrier 17 on the side thereof that faces the first connection partner 5 can have a depression in which a lower part of the first connection partner 5 is disposed for positioning the first connection partner 5, for example, this not being illustrated in FIG. 3 and FIG. 4. A frame element 29 which encircles the first connection partner 5 and is movable in relation to the workpiece carrier 17 at least in the normal direction N1 of the side 3a of the suction-fixing installation 3 that faces the compression piece 10 can be disposed on the workpiece carrier 17. The frame element 29 on the side thereof that faces the suction-fixing installation 3 has ventilation trenches 29a which in the direction perpendicular to the normal direction N1 of the side 3a of the suction-fixing installation 3 that faces the compression piece 10 run through the frame element 29.

The region which encircles the periphery of the first connection partner 5 below the film portion 4a is ventilated by the ventilation trenches 29a, this facilitating the lifting of the film portion 4a. It is furthermore preferably avoided on account of the frame element 29 that the film portion 4a adheres to the workpiece carrier 17. The same applies in an analogous manner to the pressure pad 2, if the pressure pad 2 is present and the film portion 4a is absent. It is to be noted that the frame element 29 can be disposed in a manner identical to that described above so as to be configured on the suction-fixing installation 3 also in the exemplary embodiment according to FIG. 1 and FIG. 2. Preferably elastic delimitation elements (not illustrated in FIG. 3 and FIG. 4) can disposed on the workpiece carrier 17, said delimitation elements delimiting or preventing a movement of the first connection partner 5 in the direction perpendicular to the normal direction N1 of the side 3a of the suction-fixing installation 3 that faces the compression piece 10. These delimitation elements preferably also serve as positioning aids for positioning the first connection partner 5 on the workpiece carrier 17. The delimitation elements can be configured from silicone, for example.

In the exemplary embodiment according to FIG. 3 and FIG. 4, the suction-fixing installation 3 on the side 3a thereof that faces the compression piece 10 has at least one second suction opening 15' for fixing the workpiece carrier 17 when the latter is disposed directly on the suction-fixing installation 3. The suction-fixing installation 3, when the workpiece carrier 17 is disposed above the at least one second suction opening 15', by means of generating a negative pressure at the at least one second suction opening 15', is configured for suctioning the workpiece carrier 17 and, on account thereof, for fixing the latter in relation to the suction-fixing installation 3. On account thereof, the workpiece carrier 17 is yet again additionally fixed to the suction-fixing installation 3. The suction-fixing installation 3, as is illustrated in an exemplary manner in FIG. 4, can have a plurality of second suction openings 15' which in a projected view toward the first connection partner 5 are preferably disposed so as to encircle the first connection partner 5. The at least one second suction opening 15' may also be configured in the shape of a slot.

Even though not illustrated in FIG. 3 and FIG. 4, it is nevertheless furthermore to be noted that the suction-fixing installation 3 may also have at least one third suction opening which is not disposed above the first connection partner 5, and the workpiece carrier 17 may have at least one further passage duct, wherein the at least one further passage duct is disposed so as to be aligned above the at least one third suction opening. The suction-fixing installation 3, when the film portion 4a is disposed above the at least one further passage duct, by means of generating a negative pressure at the at least one third suction opening, is configured for suctioning the film portion 4a and, on account thereof, for fixing the first connection partner 5 in relation to the suction-fixing installation 3 by way of the film portion 4a. On account thereof, the first connection partner 5 is additionally fixed indirectly in relation to the suction-fixing installation 3 by way of the film portion 4a. The suction-fixing installation 3 can have a plurality of third suction openings which in a projected view toward the first connection partner 5 are preferably disposed so as to encircle the first connection partner 5. The at least one third suction opening may also be configured in the shape of a slot.

With the exception of the differences described above, the configuration of the invention according to FIG. 3 and FIG. 4 is identical to the configuration of the invention according to FIG. 1 and FIG. 2, including advantageous configurations and variants of configurations.

The respective suction openings 9, 15, 15' of the suction-fixing installation 3 are fluidically connected to a respective negative-pressure connector 26 or 27, respectively, by way of a respective negative-pressure line duct system 20 or 21, respectively. A suctioning installation which by way of the respective negative-pressure line duct system 20 or 21, respectively, generates a respective negative pressure at the respective suction openings 9, 15, 15' of the suction-fixing installation 3 such that, when the first connection partner 5 is disposed above the first suction openings 9, the first connection partner 5 is suctioned by the first suction openings 9, or when the film portion 4a is disposed above the at least one second suction opening 15 or 15', respectively, the film portion 4a is suctioned by the at least one second suction opening 15 or 15', respectively, is connected to the negative-pressure connectors 26 or 27, respectively, said suctioning installation not being illustrated for reasons of clarity in any figures. The negative pressure generated by the suctioning installation in the negative-pressure line duct system 20 or 21, respectively, is preferably controllable in an independent manner such that the negative pressure at the first suction openings 9 and at the at least one second suction opening 15 or 15', respectively, is in each case controllable in an independent manner. The same applies in analogous manner should the suction-fixing installation 3 have at least one third suction opening.

The sintering press 1 preferably has a suction gripper 22 which by means of generating a negative pressure at the suction openings 24 thereof is configured for firmly holding the first connection partner 5 directly on said suction gripper 22 and, prior to the pressing procedure, for disposing the first connection partner 5 conjointly with the second connection partner 6 disposed above the first connection partner 5 in the space between the compression piece 10 and the suction-fixing installation 3 and/or, after the pressing procedure, for removing said first connection partner 5 conjointly with said second connection partner 6 from said space again. In the case of the configuration of the invention according to FIG. 1 and FIG. 2, for example, the suction gripper, by means of generating a negative pressure on the suction openings 24 thereof, can thus directly firmly hold the connection partner 5, that is to say here the substrate 5. Alternatively, the sintering press 1 preferably has a suction gripper 22 which, by means of generating a negative pressure at the suction openings 24 thereof, is configured for firmly holding the first connection partner 5 indirectly on said suction gripper 22 and, prior to the pressing procedure, for disposing the first connection partner 5 conjointly with the second connection partner 6 disposed above the first connection partner 5 in the space between the compression piece 10 and the suction-fixing installation 3 and/or, after the pressing procedure, for removing said first connection partner 5 conjointly with said second connection partner 6 from said space again. In the case of the configuration of the invention according to FIG. 3 and FIG. 4, for example, the suction gripper 22, by means of generating a negative pressure at the suction openings 24 thereof, can thus indirectly firmly hold the connection partner 5, that is to say here the substrate 5, in that said suction gripper 22 suctions the workpiece carrier 17 on which the first connection partner 5 conjointly with the second connection partner 6 disposed above the first connection partner 5 is disposed and, on account thereof, indirectly firmly holds the first connection partner 5 on said suction gripper 22. The workpiece carrier 17, conjointly with the first connection partner 5 and the second connection partner 6 disposed above the first connection partner 5, can be disposed by the suction gripper 22 in the space between the compression piece 10 and the suction-fixing installation 3 prior to the pressing procedure and/or can again be removed from said space after the pressing procedure. The suction gripper 22 preferably has sealing lips 25 which are in each case disposed so as to encircle one suction opening 24. The suction gripper 22 furthermore preferably has a frame 23 on which the sealing lips 25 and the suction openings 24 are disposed.

A pressure sintering method according to the invention for producing a sintered connection between the first connection partner 5 and the second connection partner 6 disposed thereabove by means of the sintering press 1 according to the invention will be described hereunder.

In a method step a), disposing between the compression piece 10 and the suction-fixing installation 3 the first connection partner 5 conjointly with the second connection partner 6 disposed above the first connection partner 5 takes place, wherein the sintering material 7 to be sintered is disposed between the first connection partner 5 and the second connection partner 6, wherein the first connection partner 5 is disposed above the first suction openings 9. The first connection partner 5 herein can be disposed directly on the suction-fixing installation 3, as is illustrated in an exemplary manner in FIG. 1 and FIG. 2. Alternatively, the first connection partner 5 herein can be disposed directly on the workpiece carrier 17 having passage ducts 16 so as to be above the passage ducts 16, and the workpiece carrier 17 can be disposed directly on the suction-fixing installation 3 in such a manner that the passage ducts 16 are disposed so as to be in alignment with the first suction openings 9, as is illustrated in an exemplary manner in FIG. 3 and FIG. 4. The disposing of the first connection partner 5 conjointly with the second connection partner 6 disposed above the first connection partner 5 herein can in each case take place by means of the suction gripper 22, as described above.

In a subsequent method step b), fixing the first connection partner 5 in relation to the suction-fixing installation 3 by suctioning the first connection partner 5 by means of generating a negative pressure at the first suction openings 9 takes place.

In a subsequent method step c), impinging the first connection partner 5 and the second connection partner 6 and the sintering material 7 with pressure takes place by converging the compression piece 10 and the suction-fixing installation 3 relative to one another, wherein, on account thereof, the first connection partner 5 and the second connection partner 6 are mutually compressed, and impinging the sintering material 7 with a temperature takes place, wherein the sintering material 7 on account of the impingement with pressure and temperature is converted to a sintered metal. The conversion of the sintering material 7 to the sintered metal takes place by sintering the metal particles contained in the sintering material 7. The metal particles in the exemplary embodiments are composed of silver such that the sintered metal in the exemplary embodiments is composed of silver. The impingement of the sintering material 7 with a temperature preferably takes place by heating the compression counterpart 11 and/or the suction-fixing installation 3 and/or the compression piece 10. The heat herein is transmitted from the first connection partner 5 and/or from the second connection partner 6 to the sintering material 7. The converging of the compression piece 10 and the suction-fixing installation 3 relative to one another in the invention can take place in that the compression piece 10 is moved downward and/or in that the suction-fixing installation 3 is moved upward, as is illustrated by the arrows 8 in FIG. 1 and FIG. 3. The suction-fixing installation 3 can move upward, for example, in that the compression counterpart 11 in FIG. 1 and FIG. 3 moves upward.

In a subsequent method step d), diverging the compression piece 10 and the suction-fixing installation 3 relative to one another takes place. The diverging of the compression piece 10 and the suction-fixing installation 3 relative to one another in the invention can take place in that the compression piece 10 in FIG. 1 and FIG. 3 moves upward, and/or in that the suction-fixing installation 3 moves downward. The suction-fixing installation 3 can move downward, for example, in that the compression counterpart 11 in FIG. 1 and FIG. 3 moves downward.

In a subsequent method step e), releasing the first connection partner 5 in relation to the suction-fixing installation 3 takes place by reinstating the gas pressure prevailing in the press chamber 28 of the sintering press 1 above the first connection partner 5 at the first suction openings 9. The gas pressure is preferably present in the form of the air pressure. Subsequently, the first connection partner 5 conjointly with the second connection partner 6 which is disposed above the first connection partner 5 and is connected to the latter by means of the sintered bond is removed from the press chamber 28 again, preferably by means of the suction gripper 22.

The film portion 4a of the film 4 is preferably disposed on the first connection partner 5 and the second connection partner 6 between method steps a) and b) or between method steps b) and c). This can take place manually or by means of a film-moving installation which disposes the film portion 4a on the first connection partner 5 and the second connection partner 6. Once the film portion 4a has been disposed on the first connection partner 5 and the second connection partner 6, said film portion 4a can be suctioned by way of the at least one second suction opening 15 or 15', respectively, which is preferably present, as has already been described above.

Between method steps d) and e), the film portion 4a can be removed from the first connection partner 5 and the second connection partner 6, for example in that the film portion 4a is lifted manually again from the first connection partner 5 and the second connection partner 6 in the direction of the normal direction N1 of the side 3a of the suction-fixing installation 3 that faces the compression piece 10. Alternatively, the lifting of the film portion 4a away from the first connection partner 5 and the second connection partner 6 in the direction of the normal direction N1 of the side 3a of the suction-fixing installation 3 that faces the compression piece 10 can also take place in an automated manner by means of a film-moving installation.

It is to be noted that of course features of different exemplary embodiments of the invention can be combined with one another in an arbitrary manner, unless the features are mutually exclusive, without departing from the scope of the invention.

Also, the inventors intend that only those claims which use the specific and exact phrase "means for" are intended to be interpreted under 35 USC 112, sixth paragraph. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A pressure sintering method for producing a sintered connection between a first connection partner (5) and a second connection partner (6), said method comprising the following steps in succession:
   providing a sintering press (1) for producing a sintered connection between said first connection partner (5) and said second connection partner (6) that is disposed above said first connection partner (5), said sintering press (1) further comprising:
   a suction-fixing installation (3) for fixing the first connection partner (5), having a compression piece (10) which is disposed above the suction-fixing installation (3);
   wherein when the first connection partner (5) and the second connection partner (6) are disposed between the compression piece (10) and the suction-fixing installation (3) and wherein the sintering press (1) is configured to converge the compression piece (10) and the suction-fixing installation (3) relative to one another,
   the suction-fixing installation (3) on a side (3a) thereof that faces the compression piece (10) has a plurality of first suction openings (9, 9') that align with a plurality of passage ducts (16) running through a workpiece carrier (17) and a plurality of second suction openings (15) that run below the workpiece carrier (17);
   the suction-fixing installation (3), when the first connection partner (5) is disposed above the plurality of first suction openings (9), by means of generating a negative pressure at the plurality of first suction openings (9), is configured for suctioning the first connection partner (5) and for fixing the plurality of first suction openings (9) in relation to the suction-fixing installation (3);
   a frame element (29) that encircles the first connection partner (5) and is movable in relation to the workpiece carrier (17) in a normal direction (N1) of the side (3a) of the suction-fixing installation (3) that faces the compression piece (10) is disposed on the workpiece carrier (17);
   the frame element (29) on the side thereof that faces the suction-fixing installation (3) has a plurality of ventilation trenches (29a) which run through the frame element (29) in the direction perpendicular to the normal direction (N1) of the side (3a) of the suction-fixing installation (3) that faces the compression piece (10); and
   the first connection partner (5) is disposed directly on the workpiece carrier (17) that has said plurality of passage ducts (16) so that the first connection partner (5) is above the plurality of passage ducts (16), and the workpiece carrier (17) is disposed directly on the suction-fixing installation (3) and the plurality of passage ducts (16) are in alignment with the first suction openings (9) and are perpendicular to the plurality of ventilation trenches (29a);
   the suction-fixing installation (3) disposed below the workpiece carrier (17) has negative pressure line duct systems (20, 21) that provide a negative pressure at the first suction openings (9, 9') and also at the second suction openings (15);
   and
   conducting the following steps;
   a) disposing between the compression piece (10) and the suction-fixing installation (3) the first connection partner (5) conjointly with the second connection partner (6) disposed above the first connection partner (5), and placing a sintering material (7) to be sintered between the first connection partner (5) and the second connection partner (6), wherein the first connection partner (5) is disposed above the plurality of first suction openings (9);

a-1) disposing a film portion (4*a*) of a film (4) on the first connection partner(S) and the second connection partner (6);

b) fixing the first connection partner (5) in relation to the suction-fixing installation (3) by suctioning the first connection partner (5) and generating a negative pressure at the plurality of first suction openings (9);

c) impinging the first connection partner (5) and the second connection partner (6) and the sintering material (7) with a pressure by converging the compression piece (10) and the suction-fixing installation (3) relative to one another, wherein the first connection partner (5) and the second connection partner (6) are mutually compressed, and impinging the sintering material (7) with a temperature, and converting the sintering material (7) by impingement with pressure and temperature to a sintered metal;

d) diverging the compression piece (10) and the suction-fixing installation (3) relative to one another;

d-1) removing the film portion (4*a*) from the first connection partner (5) and the second connection partner (6);

e) releasing the first connection partner (5) in relation to the suction-fixing installation (3) by reinstating a gas pressure prevailing above the first connection partner (5) at the plurality of first suction openings (9) and at the plurality of ventilation trenches (29*a*).

\* \* \* \* \*